United States Patent
Brunschwiler et al.

(10) Patent No.: US 9,389,362 B1
(45) Date of Patent: Jul. 12, 2016

(54) ADAPTIVE OPTICAL INTERCONNECTION OF COMPONENTS OF AN ELECTRO-OPTICAL CIRCUIT

(71) Applicant: INTERNATIONAL BUSINESS MACHINES CORPORATION, Armonk, NY (US)

(72) Inventors: Thomas J. Brunschwiler, Rueschlikon (CH); Antonio La Porta, Rueschlikon (CH); Bert J. Offrein, Rueschlikon (CH); Jonas R. Weiss, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/941,856

(22) Filed: Nov. 16, 2015

(51) Int. Cl.
G02B 6/12 (2006.01)
H01L 25/00 (2006.01)
G02B 6/138 (2006.01)
G02B 6/132 (2006.01)
G02B 6/42 (2006.01)

(52) U.S. Cl.
CPC ............ *G02B 6/12004* (2013.01); *G02B 6/132* (2013.01); *G02B 6/138* (2013.01); *G02B 6/4283* (2013.01); *H01L 25/50* (2013.01)

(58) Field of Classification Search
CPC .. G02B 6/12004; G02B 6/4283; G02B 6/132; G02B 6/138; H01L 25/50
See application file for complete search history.

(56) References Cited

U.S. PATENT DOCUMENTS

| | | | |
|---|---|---|---|
| 5,353,498 A * | 10/1994 | Fillion | H01L 21/568 257/E21.505 |
| 6,343,164 B1 * | 1/2002 | Robertsson | G02B 6/1221 385/131 |
| 8,617,935 B2 * | 12/2013 | Xu | H01L 21/561 257/E21.502 |
| 2002/0028045 A1 * | 3/2002 | Yoshimura | G02B 6/10 385/50 |
| 2003/0179979 A1 * | 9/2003 | Ouchi | G02B 6/132 385/14 |
| 2005/0158009 A1 * | 7/2005 | Eichelberger | H01L 21/56 385/147 |
| 2005/0201707 A1 * | 9/2005 | Glebov | G02B 6/1221 385/132 |
| 2007/0205513 A1 * | 9/2007 | Brunnbauer | H01L 21/561 257/746 |
| 2008/0285910 A1 * | 11/2008 | Yamada | G02B 6/12002 385/14 |
| 2014/0248723 A1 | 9/2014 | Shastri et al. | |
| 2015/0037044 A1 | 2/2015 | Peterson et al. | |

* cited by examiner

*Primary Examiner* — Ryan Lepisto
(74) *Attorney, Agent, or Firm* — Cantor Colburn LLP; Daniel Morris

(57) ABSTRACT

Embodiments include a method for interconnecting components of an optical circuit. The method includes arranging the components on a support layer and embedding them within a material, such that portions of the material that is between the components contact the support layer. The obtained components are positioned with a certain inaccuracy with respect to ideal nominal positions thereof. Next, the support layer is removed to reveal one side of the components, on which side the components are level with said portions of said material. Positions of the components are identified and a set of optical polymer waveguides are adaptively fabricated, on the one side, so as for each of the fabricated polymer waveguides to optically connect subsets of two or more of the components, according to the identified positions of the components. The present invention is further directed to related optical circuits or electro-optical circuits of interconnected components.

13 Claims, 3 Drawing Sheets

ADAPTIVE OPTICAL INTERCONNECTION OF COMPONENTS OF AN ELECTRO-OPTICAL CIRCUIT

BACKGROUND

The invention relates in general to methods for optically interconnecting electronic components of optical or electro-optical circuits. In particular, the invention is directed to methods for optically interconnecting optical or electro-optic components of optical or electro-optical circuits using optical polymer waveguides.

The fabrication of current optical components such as optical transceivers involves packaging discrete components, such as drivers, photonic-integrated-circuits, fibers and ferrules. This requires precision alignment (typically less than 2 μm in case of single-mode communication) and is therefore typically carried out using pick-and-place robots equipped with vision systems, which robots perform the alignment and bonding of components in a sequential manner (including cure or temperature ramping time).

SUMMARY

According to a first aspect, the present invention is embodied as a method for interconnecting components of an optical circuit, and, in particular, for optically connecting optical or electro-optic components. The method first comprises arranging the components on a support layer, which components may notably involve optical, electro-optic components or, even, non-optical components (e.g., electronic components). Then, the arranged components are embedded within a material, such that portions of said material that are between the components contact the support layer. The obtained components are positioned with a certain inaccuracy with respect to ideal nominal positions thereof. Next, the support layer is removed to reveal one side of the components, on which side the components are level with said portions of said material. Finally, positions of the components are identified and a set of optical polymer waveguides are adaptively fabricated, on said one side, so as for each of the fabricated polymer waveguides to optically connect subsets of two or more of the components (i.e., optical or electro-optic components), according to the identified positions of the components and notwithstanding inaccuracies in their positions.

According to another aspect, the invention is embodied as an optical circuit, or an electro-optical circuit of interconnected components, such as evoked above. The circuit comprises components arranged on a plane. In addition, it comprises a material, in which the components are embedded, wherein portions of said material that are between the components are flush with sides of the embedded components at the level of said plane, so as to define a flat surface. The components are positioned with a certain inaccuracy with respect to ideal nominal positions thereof. Consistently with the above method, the circuit further comprises a set of adaptively fabricated optical polymer waveguides, where each of the polymer waveguides optically connects subsets of two or more of the components. As the optical polymer waveguides are adaptively fabricated on said flat surface, they at least partly protrude from said plane.

Devices and methods embodying the present invention will now be described, by way of non-limiting examples, and in reference to the accompanying drawings.

Figure 1:
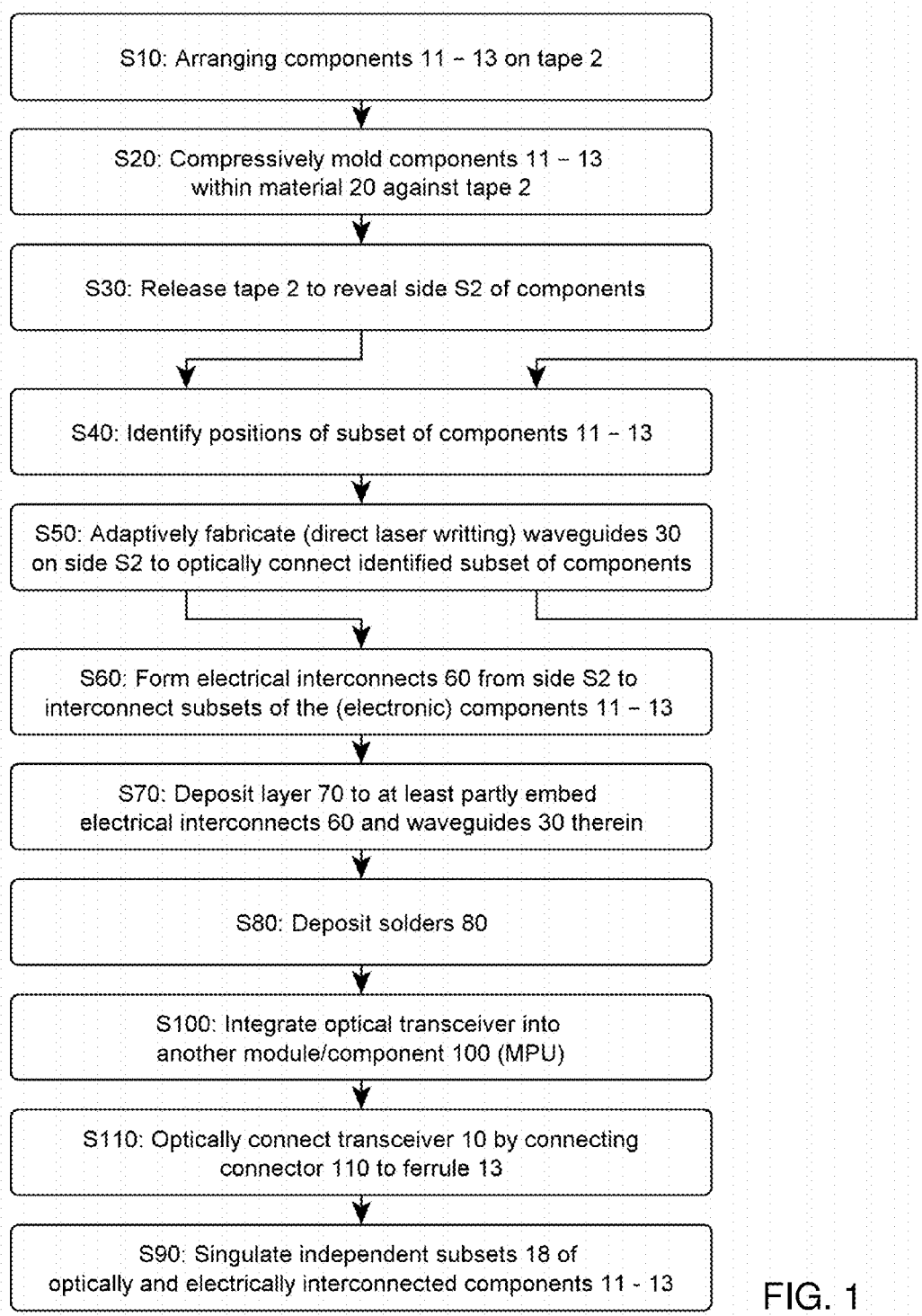
FIG. 1 is a flowchart illustrating high-level steps of a method of fabrication of a circuit according to embodiments.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

As present inventors have realized, the fabrication costs of current optical components (e.g., optical transceivers) is dominated by the packaging of discrete components such as listed earlier. In the known fabrication methods and due to the required precision alignment: (i) waveguides are first fabricated and (ii) then components are accurately positioned, according to the fabricated waveguides. Pick-and-place robots perform the alignment and bonding of components in a sequential manner, yielding moderate throughputs. Present inventors have further realized that these throughputs could be improved by reversing the order of the two steps (i) and (ii) above. They accordingly device a solution, which, according to an aspect, can be embodied as a method for interconnecting components 11-13 of an optical circuit 1, 10. This method is now described in reference to FIGS. 1, and 2-4.

Basically, the method revolves around the following steps: First, components 11-13 are arranged on a support layer 2, step S10, FIGS. 1 and 2. In the example of FIG. 2, the components 11-13 include optical or electro-optic components 12, 13, i.e., components that require optical connections. In addition, non-optical, e.g., electronic components such as component 11 may be involved. No accurate positioning of the components 11-13 is required here. The support layer 2 is for example a tape or, more generally, any kind of flat supports.

Figure 2:
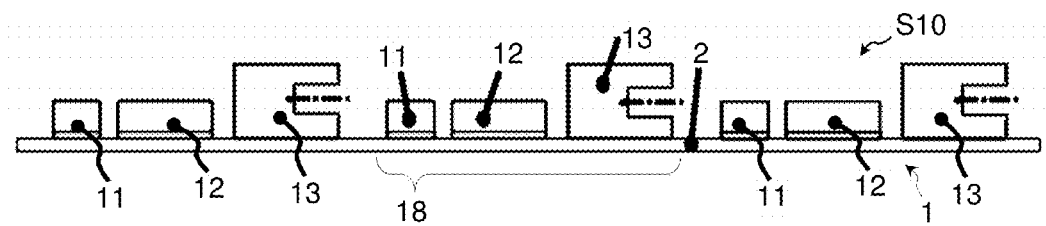
FIGS. 2, 3, 4, 5, 6 and 7 are, each, a 2D cross-sectional view of a device at various stages of its fabrication, according to embodiments.

Next, the previously arranged components 11-13 are embedded within a material 20, e.g., using compressive molding (step S20, FIGS. 1 and 2). As a result, portions 20p of the material 20 that are between pairs of components 11-13 will contact the support layer 2. Similarly, other portions 20e adjoining the components 11-13 will also contact the support layer 2. The positions of the components 11-13 need not be accurately maintained here, although a tool may be used to maintain the components in place while embedding S20 them.

At the end of step S20, the components 11-13 are positioned with a certain inaccuracy with respect to ideal nominal positions thereof and owing to the process used so far. The inaccuracy may arise due to the initial arrangement S10, i.e., the placement of the components 11-13 and/or the embedding process (e.g., compressive molding) used to embed S20 the components into the material 20. Both sources of inaccuracy can nevertheless be accounted for in the subsequent adaptive fabrication of the polymer waveguides, as explained now.

Next, the support layer 2 is removed S30. This results in revealing one side $S_2$ (FIG. 4) of the components 11-13, which was not exposed so far. The opposite side of the panel 1 is denoted by $S_1$ in the accompanying drawings. On side $S_2$, the components 11-13 are essentially level with the portions 20p of material 20, owing to the embedding process S20 discussed above. I.e., the components 11-13 and portions 20p are essentially flush, subject to minor residues of material 20 and alignment inaccuracy.

Finally, a set of optical polymer waveguides 30 are adaptively fabricated, step S50 (FIGS. 1 and 4), on the previously revealed side S$_2$. To that aim, positions 15 of the components 11-13 (or at least subsets 12, 13 thereof) need be identified S40, so that waveguides 30 can be fabricated S50 based on the identified positions, in an adaptive manner. I.e., the fabrication S50 of waveguides adapts to the actually detected positions, to make sure that each of the fabricated polymer waveguides 30 optically connects subsets of two 12, 13 (or possibly more) of the components 11-13. Thus, subsets of the components 12, 13 can be accurately connected (see FIG. 8), by way of polymer waveguides 30, thanks to the identified positions 15 of the components 11-13 and an adaptive fabrication process.

Comments are in order:

First, the components that are eventually optically connected S50 are optical, or electro-optical components, i.e., components that require an optical connection. However, the set of components 11-13 initially involved S10-S20 may also include other types of components, i.e., non-optical components such as a purely electronic component, e.g., a driver as in the example of FIGS. 2-8. In fact, other parts (e.g., mechanical parts) may be embedded together with components 11-13; and Moreover, note that, although the support layer 2 need not be flat everywhere (it may notably exhibit steps or be otherwise structured), it is at least flat at the level of pairs of components that need be optically connected by polymer waveguides.

In the above approach, the traditional two-step order of fabrication is reversed. Here, the components are first arranged S10 (with at most moderate accuracy) on the support 2 and then optically connected S50 (notwithstanding inaccuracies in the positions the components), after having removed S30 (e.g., released) the support 2. In other words, present methods break free of the constraints posed by the prior, accurate positioning of the components. Fabrication throughputs can thus be improved, notably by taking advantage of fast and accurate optical wiring methods available, such as direct laser writing of polymer waveguides.

Direct laser writing is also known as (multi-)photon direct laser lithography. The structuring is obtained by illuminating negative or positive-tone photosensitive photoresists using light of a well-defined wavelength. Two-photon absorption can be used to induce changes in the solubility of the resist. Either laser writing technique can be applied in the present context for creating small features from a photosensitive material, without requiring a sophisticated optical system or photomasks. Advantage is taken from the flat (or at least locally flat) surface (that coincides with plane P, parallel to (x, y) in the accompanying drawings, see e.g., FIGS. 3, 4) as obtained upon completion of step S30, to deposit and pattern the photosensitive material.

The fabricated optical waveguides may be optimized by path optimized S-bend interpolation to reduce optical latency and/or optical loss. In addition, tapered waveguide structures may be used for coupling the waveguides 30 to other waveguides 123, located on the components 12, where necessary.

Figure 8:
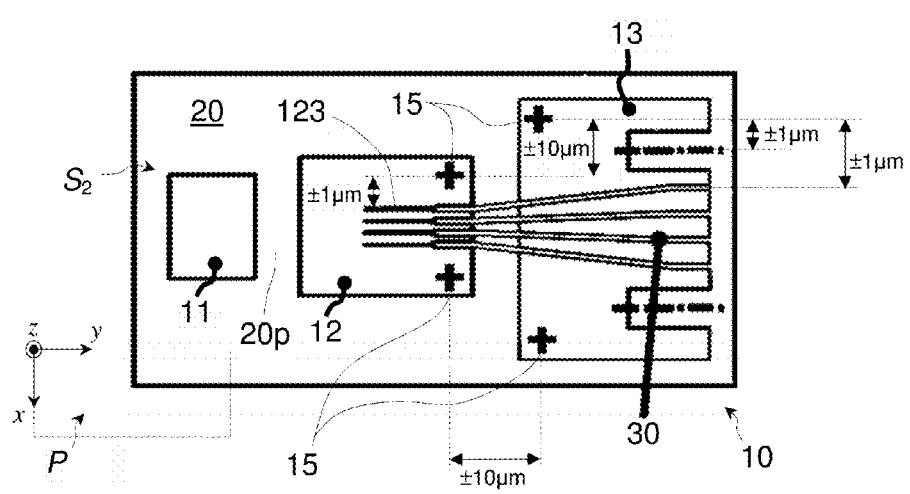
FIG. 8 is a bottom view of an optical device according to embodiments, which device was obtained according to the fabrication method illustrated in FIGS. 1-7.

Referring now to FIGS. 1 and 8 altogether, the step of identifying S40 positions of the components 11-13 preferably relies on fiducials 15 that are provided directly on the components 11-13. In variants, one may seek to automatically identify other predefined features of the components. Yet, using fiducial markers makes it possible to easily identify the actual and inaccurate positions of the components 11-13. Although the initial placement S10, S20 of the components 11-13 may be inaccurate, fiducials allow the actual positions of these components to be accurately identified. Step S40 can be performed prior to or while fabricating the polymer waveguides, which, in turn, allows to adaptively fabricate the polymer waveguides, based on the detected positions. Any suitable vision system may be used to that aim. Vision systems are known per se. To that aim, a vision system may be adequately coupled to or integrated in a direct laser writing system, whereby outputs of the former are fed as inputs into the latter, for subsequent automation of the polymer waveguide fabrication.

Figure 3:
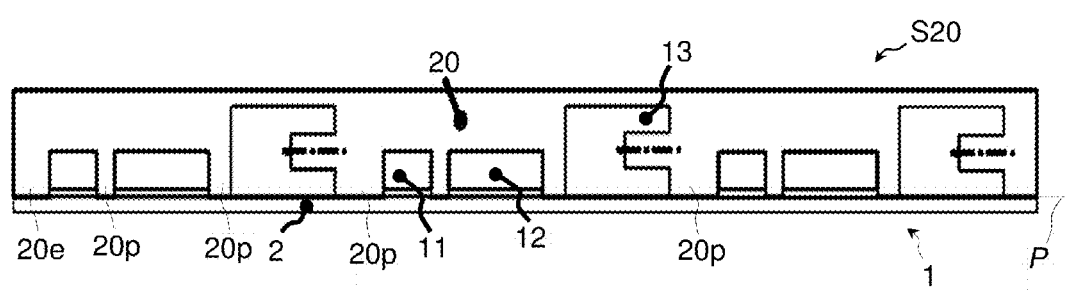
Figure 4:
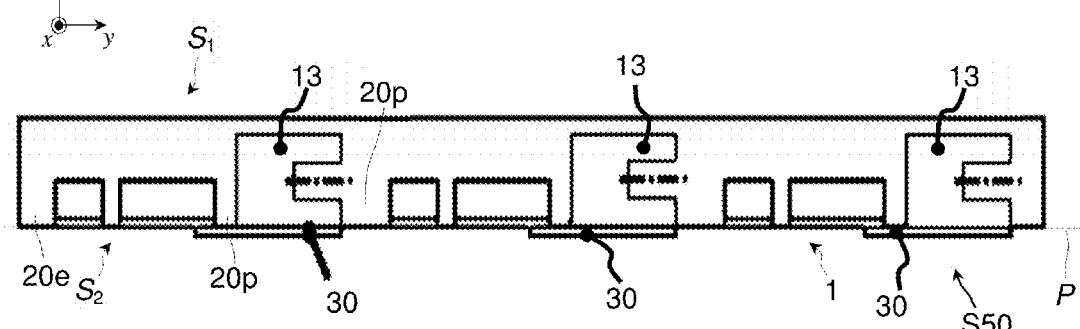

As evoked earlier, the step of embedding S20 preferably comprises compressively molding S20 the arranged components 11-13 (FIGS. 1 and 3). The components 11-13 may thus be embedded in the material 20 by compression mold technology, which eventually leads to moderate positioning accuracy of the components (typically ±10 µm). Upon completion of the compressive molding step S20, a wafer or panel 1 is obtained, in which components are embedded.

Examples of suitable materials 20 are, e.g., encapsulant materials, which are typically based on epoxy polymers that are thermally curable. Epoxies will preferably be filled with filler particles, whose dimensions are in the range 1-10 µm, for thermal stress adaption. Suitable filler particles are silica beads or other softener polymers particles. Using compressive molding and direct laser writing techniques such as described above makes embodiments of the present methods compatible with high-volume die-attach manufacturing tools, such as the so-called Datacon 8800, ±5 µm @ 3 sigma, and wafer or panel scale processing.

Figure 5:
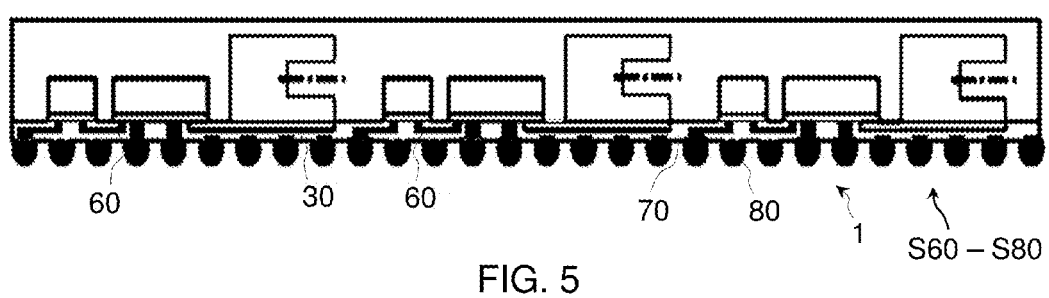
Figure 6:
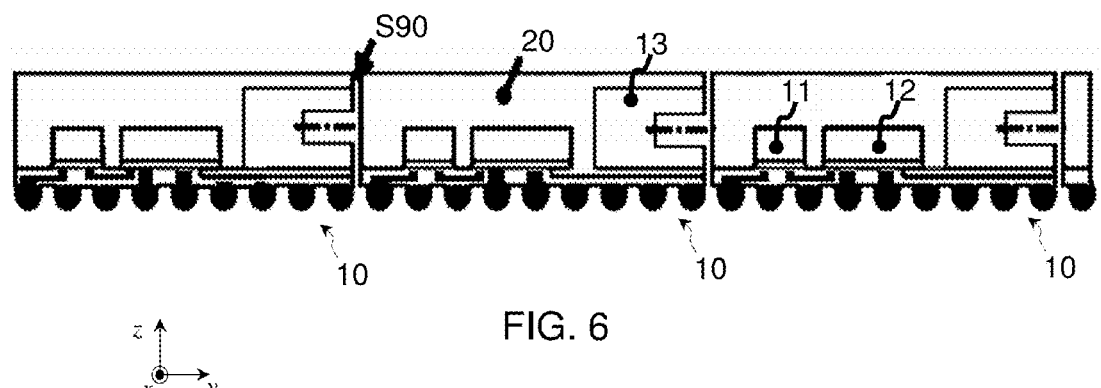

Referring now to FIGS. 1 and 5: in embodiments, the present methods may further comprise a step of forming S60 electrical interconnects from the side S$_2$ of the panel 1, in order to electrically interconnect S60 subsets of the components 11-13. Note that, here, both electronic and/or electro-optical components may be involved and get electrically interconnected, in contrast with step S50, where only (electro-)optical components were involved. As a result of the electrical interconnection S60, the panel 1 can now be regarded as an electro-optical circuit. Note that step S60 may advantageously re-use positions of the remaining components identified at step S40.

In embodiments, after having formed S60 the electrical interconnects, one may apply (e.g., deposit and cure) a protective layer 70 (an electrically insulating material) on said side S$_2$ of the panel 1, so as for the polymer waveguides 30 and the formed electrical interconnects 60 to be at least partly embedded in the applied layer 70. Residual parts of the polymer waveguides 30 and the electrical interconnects 60 may nevertheless be flush with or even slightly protrude from the new exposed surface (the exposed surface of the layer 70), depending on the subsequent electrical, or electro-optical scheme desired.

Next, solders 80 may be deposited S80 on the layer 70, so as for the deposited solders 80 to be in electrical connection with, e.g., some or all of the electrical interconnects 60. Solder deposition is known per se.

Referring now to FIGS. 2, 6, 7 and 8: in embodiments, the components 11-13 may comprise independent subsets 18 of components 11-13, which can nevertheless be concomitantly wired (both optically and electrically), thanks to the present methods. This, in turn, enables rapid mass fabrication. Subsets 18 may for instance consist of repeating sequences of components 11-13, as assumed in FIGS. 2-7. After step S50

(or even after step S60 or S80), these subsets form sets of components 11-13, which are optically and electrically interconnected independently from each other.

Thus, portions corresponding to independent subsets 18 of optically and electrically interconnected components 11-13 can subsequently be singulated S90, e.g., by dicing such portions. Several electro-optical circuits 10 can accordingly be fabricated in parallel, which integrate components that are similarly or differently configured.

In this respect, and referring now more specifically to FIG. 8: a singulated circuit 10 may, in embodiments, notably comprise an electric driver 11, a photonic-integrated-circuit 12 and a ferrule 13. The latter may be suitably interconnected to form an optical transceiver 10 package, as assumed in FIGS. 2-8. Other or additional components may be included into the circuits 10, such as lenses, to facilitate optical signal interfacing, or a laser. In addition, other configurations can be contemplated for the electro-optical components in the transceiver package 10, such as a driver-to-PIC relative position and a relative assembly. In addition, other configurations of the transceiver package are possible, such as the so-called EO electric-optical components up configuration.

Figure 7:
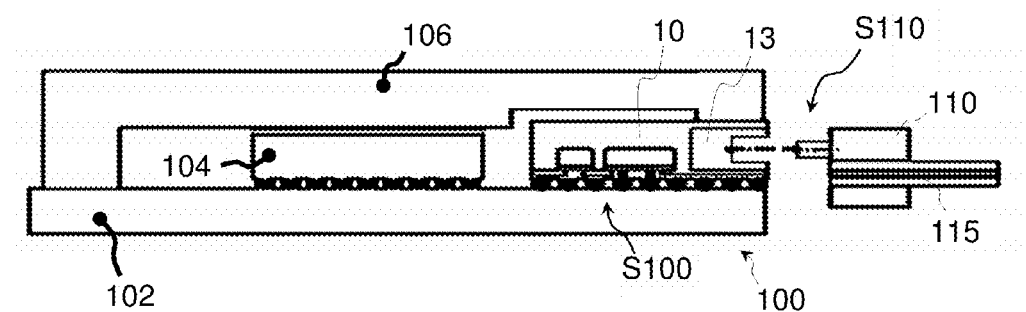

Next, embodiments of the present methods may further comprise a step of integrating S100 a previously obtained optical transceiver 10 into another component 100, as depicted in FIG. 7. In particular, the component 100 may be a module 100 of a microprocessor unit (MPU). To that aim, the optical transceiver 10 may be integrated S100 into the module 100 using solder reflow techniques.

For completeness, the present methods may further comprise optically connecting S110 the transceiver 10 (be it in a module 100 or not) to an optical fiber 115. The fiber 115 may be secured in a connector 110, which ensure a correct optical coupling, through well-calibrated mechanical connectors. In variants, one may use an array of fibers arranged in a multi-fiber connector (like a Mechanical Transfer [MT] connector). An example of coupling through mechanical connectors is discussed below in reference to FIG. 8.

Referring now to FIG. 8: according to another aspect, the invention can be embodied as an optical circuit 1, 10 of interconnected components 11-13. The latter may be obtained by any embodiment of the above fabrication methods. As a result, the circuit 1, 10 comprises components 11-13 that are arranged in-plane, i.e., a side or an edge of the components 11-13 resides on a plane P, parallel to (x, y). Said plane delimits the side $S_2$ of the panel 1 identified earlier. In addition, the circuit 1, 10 further comprises the material 20, in which the components are embedded. Due to the embedding technique used (e.g., compressive molding), inter-component portions 20p of the material 20 are flush with sides or edges of the embedded components 11-13 at the level of the plane P. The portions 20p of the material 20 and sides (or edges) of the embedded components 11-13 altogether define a surface that coincides with the plane P, which is at least locally flat (i.e., this surface need not be flat over the whole panel 1).

Again, as per the positioning and embedding techniques used, the components are positioned with a certain inaccuracy with respect to nominal positions that one would otherwise ideally seek for such components. Still, thanks to adaptively fabricated optical polymer waveguides 30, each of the waveguides 30 optically accurately connects subsets of two 12, 13 or more of the components. The optical polymer waveguides are fabricated (e.g., using a direct laser writing process) on the flat surface that coincides with the plane P, such that the waveguides at least partly protrude from the plane P.

As said earlier, in embodiments, each of the connected components 12, 13 may comprise fiducials 15, to ease the connection. In addition, the circuit 1 may further comprises a layer of electrically insulating material (not shown in FIG. 8, for clarity), as well as electrical interconnects (not shown in FIG. 8), which electrically interconnect subsets of the components to form an electro-optical circuit 10. The polymer waveguides 30 and the electrical interconnects may be at least partly embedded in the layer of electrically insulating material.

The components of the circuit 1, 10 may notably comprise one or more of: a driver 11, a photonic-integrated-circuit 12, a ferrule 13, one or more lenses, laser devices, etc. Said components may be suitably interconnected in the circuit 1, 10 to form, e.g., an optical transceiver 10.

In embodiments, a singulated circuit 10 is integrated in another component, e.g., a MPU module 100. In the example of FIG. 7, the transceiver 10 and the MPU 104 are integrated on a common substrate 102 and covered by a same lid 106, which is designed to accommodate the different heights of the components 10, 104.

As further depicted in the example of FIG. 8, the created S50 polymer waveguides 30 may be optically coupled to optical waveguides 123 provided directly on some 12 of the components (photonic circuit 12). Optical coupling between the waveguides can notably be ensured through butt-coupling. Alternatively, optical coupling through adiabatic mode adaption can be provided by tapering at least one of each waveguide of the waveguide array depicted in FIG. 8. The waveguides 30 can else be directly written on other components, such as ferrules 13. A waveguide can then precisely butt-coupled to an end terminal of a fiber brought in by a counterpart of the ferrule. As further illustrated in FIG. 8, the steps of adaptive fabrication S50 and mechanical coupling S110 allow, each, for accuracies on the order of ±1 µm. On the contrary, more moderate accuracies (on the order of ±10 µm) can be afforded in the initial placement S10, S20 of the components.

The methods as described above can be used in the fabrication of integrated circuit chips, and notably photonics chips. The resulting chips can be distributed by the fabricator in raw wafer form (that is, as a single wafer 1 that has multiple unpackaged chips 10), as a bare die, or in a packaged form 100. In the latter case the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims.

In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method for interconnecting components of an optical circuit, the method comprising:
 arranging the components on a support layer;
 embedding the arranged components within a material, such that portions of said material that are between the components contact the support layer, to obtain components that are positioned with a certain inaccuracy with respect to ideal nominal positions thereof;
 removing the support layer to reveal one side of the components, on which side the components are level with said portions of said material; and
 identifying positions of the components and adaptively fabricating, on said one side, a set of optical polymer waveguides, so as for each of the fabricated polymer waveguides to optically connect subsets of two or more of the components, according to the identified positions of the components.

2. The method of claim 1, wherein identifying said positions comprises identifying fiducials on the components, prior to or while adaptively fabricating the set of optical polymer waveguides.

3. The method of claim 1, wherein embedding comprises compressively molding the arranged components.

4. The method of claim 1, wherein each of the optical polymer waveguides of the set is adaptively fabricated by direct laser writing.

5. The method of claim 1, further comprising forming electrical interconnects from said one side of the components, to electrically interconnect subsets of the components and obtain an electro-optical circuit.

6. The method of claim 5, further comprising applying a layer of an electrically insulating material on said one side of the components, so as for the polymer waveguides and the formed electrical interconnects to be at least partly embedded in said layer of electrically insulating material.

7. The method of claim 6, further comprising depositing solders on said layer of electrically insulating material, so as for the deposited solders to be in electrical connection with at least some of the electrical interconnects.

8. The method of claim 5, wherein the components comprise independent subsets of optically and electrically interconnected components, and wherein the method further comprises singulating said independent subsets of optically and electrically interconnected components.

9. The method of claim 8, wherein: at least one of the singulated independent subsets comprises: a driver; a photonic-integrated-circuit; and a ferrule; and said at least one of the singulated subsets forms an optical transceiver.

10. The method of claim 9, further comprising integrating the optical transceiver into another component.

11. The method of claim 10, wherein said another component is a module of a microprocessor unit.

12. The method of claim 10, wherein the optical transceiver is integrated into said another component by solder reflow.

13. The method of claim 10, further comprising optically connecting the transceiver to an optical fiber by mechanically connecting a connector comprising said optical fiber to said ferrule.

* * * * *